United States Patent [19]

Ohashi

[11] Patent Number: 4,463,618

[45] Date of Patent: Aug. 7, 1984

[54] PUSHBUTTON TUNER

[75] Inventor: Tamaki Ohashi, Tokyo, Japan

[73] Assignee: Nihon Technical Kabushiki Kaisha, Japan

[21] Appl. No.: 155,167

[22] Filed: Jun. 2, 1980

[30] Foreign Application Priority Data

Jun. 4, 1979 [JP] Japan .................................. 54-68838
Aug. 22, 1979 [JP] Japan ................................ 54-106032

[51] Int. Cl.³ .............................................. H03J 5/12
[52] U.S. Cl. ...................................... 74/10.33; 334/7
[58] Field of Search ........................... 74/10.33; 334/7

[56] References Cited

U.S. PATENT DOCUMENTS 2,344,091 3/1944 Kirk ............................... 74/10.33 X
4,099,421 7/1978 Ohashi ............................. 74/10.33
4,204,179 10/1978 Kataoka et al. ............... 74/10.33 X Primary Examiner—Allan D. Herrmann
Attorney, Agent, or Firm—Robert E. Burns; Emmanuel J. Lobato; Bruce L. Adams

[57] ABSTRACT

A pushbutton tuner has a plurality of pushbutton actuators each comprised of a slide plate carried by a support plate for movement between operative and inoperative positions, a lockable control plate pivotally mounted on the slide plate, and a pair of upright pins fixedly mounted on the control plate. A pair of movable plates are carried by the support plate so as to be movable across the array of slide plates and both movable plates are formed with cam edges adapted to engage one of the upright pins of the pair as the slide plate moves to its operative position. The pair of movable plates are connected at one end to first and second link members which cause the movable plates to move in opposite directions in response to the engagement of respective ones of the upright pins with respective ones of the cam edges of the movable plates. When both upright pins simultaneously engage the cam edges, the movable plates cease to move and a component of force acts on each point of engagement between the pins and the cam edges to prevent further movement of the movable plates to thereby define preset tuning frequencies. A variable tuning element has a pair of movable members connected to the first and second link members such that when one movable member ceases to move, forces acting in the same direction are applied to the pair of movable members to thereby transmit forces acting in opposite directions to the variable tuning element. Such a construction enables smooth movement of the actuators in response to a pushing force of reduced magnitude and eliminates mechanical rattling at the pivotal connection points of the parts.

10 Claims, 14 Drawing Figures

PUSHBUTTON TUNER

FIELD AND BACKGROUND OF THE INVENTION

The invention relates to a pushbutton tuner for a radio receiver, and more particularly, to a pushbutton tuner which achieves a precise tuning to a preset desired frequency associated with a particular pushbutton whenever the latter is driven to its operative position.

A pushbutton tuner is well known having a plurality of pushbuttons arranged to achieve a tuning to a plurality of preset frequencies so that whenever a particular pushbutton is driven to its operative position, a tuning to a corresponding frequency is achieved. Such a pushbutton tuner includes a plurality of manually operated slides in the form of flat plates which are arranged so that their surfaces are coplanar. Each of the slides is independently movable between its inoperative and its operative positions, and whenever one of the slides is driven to its operative position, a control member which is carried by the slide causes a displacement of a tuning element through a given distance, the element being disposed so as to be movable in a direction perpendicular to the direction of movement of the slide. The displacement of the tuning element operates an armature which is telescoped into a tuning coil of the tuner, thus achieving a tuning to a desired frequency. In order to realize a tuning to a particular frequency, the control member can be positioned relative to its corresponding slide and is locked in position. Unless it is unlocked, the control member maintains its given orientation. The tuning element is formed with a plurality of notches one for each of the control members and which is adapted to be engaged by part of the control member corresponding to each of the slides. Usually, these notches are each formed as a pyramidal surface having one or two linear bevelled surfaces. When the part of the control member is engaged with the corresponding notch, and is driven along the bevelled surface of that notch in response to a force applied thereto, a component of the force causes the tuning element to move in a direction perpendicular to the applied force, with its movement continuing until it is constrained by the apex of the bevelled surface. The tuning element can also be controlled to a position correseponding to a desired frequency to be received, by a manually rotatable knob which operates through a clutch. In this instance, if the unlocked control member is engaged with the apex of the corresponding bevelled surface, it can be positioned to provide a tuning to a particular frequency. When positioning the control member, the clutch maintains an operative connection between the rotatable knob and the tuning element, but is deactuated to interrupt the operative connection between the rotatable knob and the tuning element during a normal use when a selected slide is driven to its operative position in response to an operation of a pushbutton.

In the construction of such a conventional pushbutton tuner, each slide is slidably disposed in a slot formed in a baseplate or support plate and which guides the direction of movement of the slide. To support the slide in a slidable manner, the size of a slot must be greater than the outer profile of the slide in order to reduce the frictional resistance. However, an increased clearance between the slide and the slot may cause a rattling in the movement of the slide. When such rattling is present, if the control member is engaged with the apex of the bevelled surface in the notch which represents a reference position to provide a tuning to a desired frequency, the slide will be displaced by an amount corresponding to the degree of rattling, which displacement is transmitted to the tuning element to cause its misalignment. An error in the tuning accuracy of the tuning element will be caused even by a small displacement or rattling of the slide. If the pushbuttons are arranged to establish exact desired frequencies when the tuner assembly is initially calibrated, each subsequent operation of the pushbutton will result in a tuning to an inaccurate offset frequency.

CROSS-REFERENCE TO RELATED APPLICATIONS

After various studies have been made to locate the cause of occurrence of the rattling, it is found that because the conventional pushbutton tuner as mentioned above includes a single tuning member, the latter may be displaced by a component of the pushing force of the control member even though the point of engagement between the control member and the recess is located at the apex thereof which provides a reference position for the desired frequency. Therefore, the present applicant has proposed a novel pushbutton tuner which is the subject of a patent application Ser. No. 140,445 filed Apr. 17, 1980, now U.S. Pat. No. 4,351,195 and entitled "Pushbutton Tuner".

This pushbutton tuner is provided with a pair of transversely movable plates, and each of the pushbutton actuators includes a slide plate on which a control plate is disposed having upright pins on its opposite ends. The intermediate length of this control plate is pivotally mounted on the slide plate. One of the upright pins on the control plate engages a linear cam edge of a first cam member when a pushbutton is driven to its operative position. The first cam member has its one end pivotally mounted on a baseplate and has a notch formed in its other end which is engaged by an upstanding pin on one of the movable plates. The other upright pin on the control plate is located to be engageable with a linear cam edge of a second cam member which is pivotally mounted on the baseplate at its one end and which has a notch formed in its other end which is in-turn engaged by an upstanding pin formed on the other movable plate. One end of each of the movable plates is pivotally connected to one end and the other end of a rockable link member which is pivotally mounted intermediate its length. Consequently, when the pushbutton is driven to its operative position, the force applied thereto causes one of the upright pins on the control plate to be engaged with the cam edge of one of the cam members, causing the latter to rotate in one direction. In response to such rotation, the movable plate which is connected to that cam member moves in one direction. This movement of the movable plate is effective to cause the other movable plate to move in the opposite direction from the movement of the first mentioned movable plate through the rockable link member. Then, the other cam member rotates in a direction opposite from the first mentioned cam member, the direction of its rotation being in the direction toward the other upright pin. When the other cam member engages with the other upright pin, the first mentioned cam member cannot rotate any further if an increased force is applied to the pushbutton, since the other cam member is prevented from rotating by the other upright pin. In this manner, the position of the movable members when they are made immovable corresponds to a given preset frequency. What is important here is that although components of the force applied to the pushbutton are developed at the points of engagement between the pair of upright pins and the pair of cam members, these components act in one direction, and a reaction force is exerted upon the slide plate through the control plate in order to maintain the slide plate urged against the edge of the slot in the baseplate which slidably supports the slide plate, thus removing any rattling therebetween. Therefore, no displacement of the movable plate is caused by such rattling, permitting an accurate tuning to a desired preset frequency. It will also be noted that these components of the force urge the pair of movable plates in the same direction, thus removing any rattling in the connection between the movable plates and the rockable link member.

While a rattling between the slide plate and the slot window is removed in this manner, a movable member of a variable tuning element cannot be directly connected with the movable plate, frequently in a pushbutton tuner of a limited size. In such instance, a linkage is used to provide a connection between the movable plate and the movable member of the variable tuning element. However, the use of the linkage causes a rattling to be produced at the pivotal connection, which prevents an accurate tuning. Hence, the invention provides a connection mechanism in the pushbutton tuner of the earlier filed application which transmits a movement of the movable plate to the variable tuning element in an exact manner, and thus provides a pushbutton tuner which eliminates a rattling between the movable plate and the movable member of the variable tuning element to permit a precise tuning to a desired frequency. In addition, the invention provides a pushbutton tuner in which the movable plate is supported in a movable manner by using a linkage alone so that a pushing force of a reduced magnitude applied to a pushbutton is sufficient to permit a movement of the movable plate.

SUMMARY OF THE INVENTION

It is an object of the present invention to provide a pushbutton tuner which permits desired frequencies to be precisely established and which permits a precise tuning to one of the established frequencies in response to a subsequent operation of a pushbutton.

It is another object of the invention to provide a pushbutton tuner which permits a precise tuning to a desired frequency by a pushing force of a reduced magnitude during a normal channel selection.

It is a further object of the invention to provide a pushbutton tuner which is simple in construction and which can be manufactured within the commercially permissible tolerances without causing a tuning error.

In accordance with the invention, there is provided a pushbutton tuner including a support, tuning means mounted on the support so as to be movable to positions corresponding to preset tuning frequencies, and a plurality of pushbutton actuators which may be selectively preset to bring the tuning means to positions corresponding to the tuning frequencies, each pushbutton actuator incuding a slide member having its opposite ends carried by the support so as to be movable between its inoperative and its operative positions relative to the support in a direction perpendicular to the direction of movement of the tuning means, and a lockable control member pivotally mounted on the slide member for controlling the movement of the tuning means. The tuning means includes a pair of movable members, a variable tuning element which is adjusted in accordance with a stroke through which the pair of movable members move, a link assembly which connects the pair of movable members with the variable tuning element, the link assembly being constructed such that whenever one of the movable members move in one direction, the other movable member is caused to move in the opposite direction, and means responsive to a movement of the slide member to its operative position for transmitting the movement of the control member to at least one of the movable members so as to cause the movable member to move in one direction, the movement of said one movable member in said one direction being terminated when a movement of the other movable member in the opposite direction which occurs in response to the movement of said one movable member is constrained by the control member. The link assembly comprises a first link member having its one end connected to said one movable member, and a second link member having its one end connected to the other movable member, the other ends of the first and the second link members being connected to the variable tuning element, the first and the second link members being connected to the respective movable members in a manner such that when said other movable member ceases to move, forces acting in the same direction are applied to the pair of movable members to transmit forces acting in the opposite directions to the variable tuning element.

In a preferred embodiment of the invention, there are provided a pair of movable plates which are movable in a transverse direction, and a pair of substantially L-shaped link levers having their one ends extending in opposite directions and having their other ends disposed in overlaying relationship. Said one end of each link lever is pivotally connected to one end of each of the movable plates. At their bend, the pair of link levers are pivotally mounted in common, and a link bar has its one end pivotally mounted on the other end of each link lever, the other ends of the two link bars being pivotally mounted in common on a movable member of a variable tuning element. Each pushbutton actuator includes a slide plate on which a control plate carrying upright pins on its opposite ends is disposed. Intermediate its length, the control plate is pivotally mounted on the slide plate. The pair of movable plates are each formed with a notch in which the upright pin on each pushbutton actuator is loosely fitted. One of the upright pins on the control plate engages a cam edge of the notch formed in one of the movable plates whenever the pushbutton has moved to its operative position, thus causing the movable plate to move in one direction. This movement is transmitted to the other movable plate through the link lever and the link bar, whereby the other movable plate moves in the opposite direction from the first mentioned movable plate. When the other movable plate has moved to a point where the other upright pin on the control plate engages the notch formed in the other movable plate, the first mentioned movable plate cannot move any further since a subsequent movement of the other movable plate is blocked by the other upright pin. The position assumed by the movable plates when they are disabled to move any further corresponds to a given frequency established. Although a component of the pushing force applied to the pushbutton is developed at the respective points of engagement between the pair of upright pins and the pair of movable plates, these components act in the same direction, and a reaction force operates on the slide plate through the control plate, whereby the slide plate is urged against the edge of the slot formed in the baseplate which supports the slide plate in a slidable manner. In this manner, any rattling therebetween is removed. The component forces acting in the same direction are applied to the pair of link bars, causing one of them to move clockwise and causing the other link bar to move counter-clockwise. As a consequence, the other ends of the two link levers tend to move in opposite directions, urging the movable member of the variable tuning element, which is pivotally mounted on the other ends of the two link bars, in opposite directions, thus removing rattling of the pivotal connection beween the movable plates and the movable member.

The pushbutton tuner of the invention is supported on a support by means of a separate link assembly which is provided on the other ends of the pair of the movable plates and which angularly moves in the same direction as the movable plates whenever they move relative to each other. In this manner, the pair of movable plates is permitted to move in a smooth manner, in response to a pushing force applied to the pushbutton which is of a reduced magnitude. In a preferred embodiment, the link assembly includes a pair of link bars, which have their one ends pivotally mounted on one of the movable plates and which have their other ends pivotally mounted in common on the support plate.

DESCRIPTION OF PREFERRED EMBODIMENTS

Preferred embodiments of the invention will be described below with reference to the attached drawings wherein corresponding parts are designated by like reference numerals.

Figure 1:
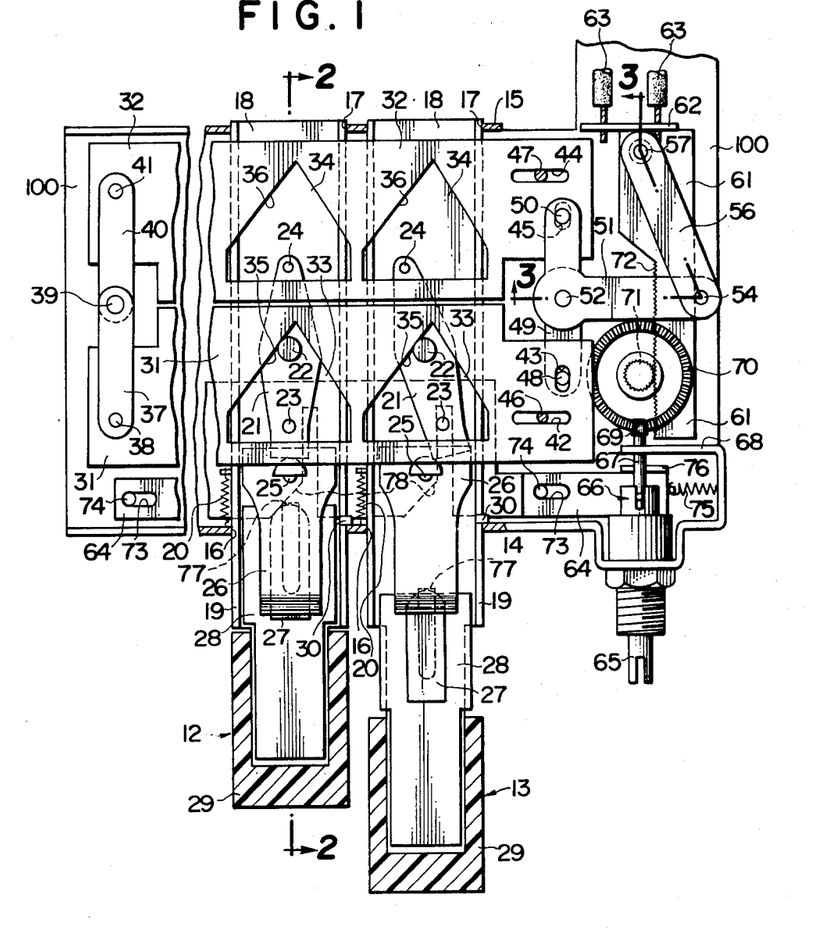
FIG. 1 is a plan view, partly cut away, of essential parts of a pushbutton tuner according to a first embodiment of the invention.
Figure 2:
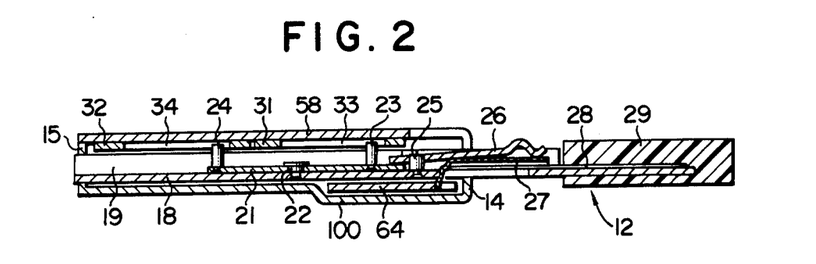
FIG. 2 is a longitudinal section taken along the line 2—2 shown in FIG. 1.
Figure 3:
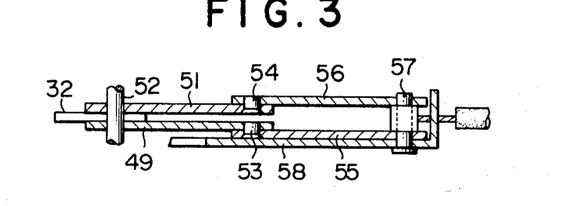
FIG. 3 is a cross section taken along the line 3—3 shown in FIG. 1.

Referring to FIGS. 1 to 3, there is shown a pushbutton tuner according to the invention which includes a baseplate 100. A pair of pushbutton actuators generally designated by reference numerals 12, 13 are slidably disposed on the baseplate 100. Each pushbutton actuator is constructed in an identical manner, and hence only the actuator 12 will be described in detail. It should be understood that while only two actuators are shown in FIG. 1, the number of thepushbutton actuators need not be limited to two.

The baseplate 100 is integrally formed with a front and a rear wall 14, 15 which are formed with window slots 16, 17, respectively. The pushbutton actuator 12 includes a slide plate 18 which is slidably received in such slot 16 or 17. The slide plate 18 is integrally formed with upstanding ribs 19 lengthwise along its opposite lateral edges. A spring 20 has its one end connected to the slide plate 18 and its other end anchored to the front wall 14, whereby the slide plate 18 is normally biased forwardly or toward its inoperative position. In the specification, the term "front" refers to the side of the tuner which is located nearer an operator or the lower side as viewed in FIG. 1. In the similar sense, the term "rear" refers to the opposite side or the upper side as viewed in FIG. 1. A control plate 21 extending lengthwise of the slide plate 18 is pivotally mounted on top of the slide plate 18 by means of a pivot 22, and fixedly carries a pair of upright pins 23, 24 on the opposite ends of its upper surface. It will be understood that the angular orientation of the control plate 21 relative to the slide plate 18 can be adjusted, but is locked by a locking lever 26 which is mounted on a pin 25 secured to the upper surface of the slide plate 18. At this end, a preset plate 28 which carries a wedge portion 27 on its upper surface is slidably mounted on top of the slide plate 18, the wedge portion 27 acting to cause the locking lever 26 to engage with the control plate 21. A pushbutton 29 is secured to the free end of the preset plate 28, and the free end of the slide plate 18 is detachably fitted into the pushbutton 29. One of the upstanding ribs 19 of the slide plate 18 is formed with a tab 30 which is disposed for abutment against the front wall 14, thus preventing a further movement of the slide plate 18 forwardly beyond its inoperative position under the action of the spring 20. Accordingly, when the pushbutton 29 is pulled forward from its inoperative position, only the preset plate 28 is driven away from the locking lever 26, releasing the control plate 21 to its reset position. The pushbutton actuator 13 shows this reset position.

A pair of movable plates 31, 32 which lie in a common plane are disposed transversely of an array of the slide plates 18, and are disposed parallel to each other. When the pushbutton 29 is operated to its operative position or driven rearwardly to cause a sliding movement of the slide plate 18 rearward, the movable plates 31, 32 are caused to move in a direction perpendicular to the direction of movement of the slide plate. The slide plate 18 and the movable plates 31, 32 are interlocked to each other through notches 33, 34 formed in the movable plates 31, 32. Specifically, the upright pin 23 on the control plate 21 is loosely fitted in the notch 33 formed in the movable plate 31 while the upright pin 24 on the control plate 21 is loosely fitted in the notch 34 formed in the movable plate 32. Each notch, 33, 34 is formed with an inverted V-shaped cam edge 35, 36 which can be engaged by the top end of the upright pin 23 or 24. It should be noted that a combination of such notches 33, 34 is provided for each pair of upright pins 23, 24 on the control plate 21 of each pushbutton actuator. These notches are configured in an identical form. Reference numeral 58 in FIG. 2 represents a top cover member which is slightly spaced above the movable plates 31, 32 and which has its front and rear ends fixedly supported by the upper ends of the walls 14, 15.

The left-hand end, as viewed in FIG. 1, of the movable plate 31 has a pin 38 which pivotally mounts one end of a link bar 37, the other end of which is pivotally mounted on a pivot pin 39 which is mounted on the baseplate 100 intermediate both of the movable plates 31, 32. A link bar 40 has its one end pivotally mounted on the pivot pin 39 and has its other end pivotally mounted on a pin 41 which is carried by the left-hand end, as viewed in FIG. 1, of the movable plate 32. The right-hand end, as viewed in FIG. 1, of the movable plate 31 is formed with an elongate slot 42 which extends in the direction of movement of the movable plate 31 and another elongate slot 43 which extends in the direction of movement of the slide plate 18. Similarly, the right-hand end of the movable plate 32 is formed with elongate slots 44, 45. Guide pins 46, 47 which are fixedly mounted on the baseplate 100 at their lower ends are loosely fitted in the elongate slots 42, 44, thus constraining the direction in which the movable plates 31, 32 move. An upright pin 48 is loosely fitted in the elongate slot 43, and has its one end secured to one end of a substantially L-shaped link lever 49. Similarly, an upright pin 50 is loosely fitted in the slot 45, and has its one end secured to one end of a link lever 51 which is similarly shaped as the link lever 49. It will be seen from FIGS. 1 and 3 that the link lever 49 is located below the movable plate 31 while the link lever 51 is located above the movable plate 32. At their bend, the link levers 49, 51 are pivotally mounted on a common pivot pin 52. The other end of each link lever 49, 51 is pivotally connected to one end of a link bar 55, 56 through a pin 53, 54, respectively, and the other end of the link bar 55, 56 is pivotally mounted on a common pivot pin 57 which has its lower end secured to an armature support plate 61. By utilizing the link levers 49, 51 and the link bars 55, 56, it is possible to move the armature support plate 61 in the fore-and-aft direction in response to a sliding movement of the movable plates 31, 32 in the lateral direction.

The purpose of the armature support plate 61 is to achieve a tuning to a desired frequency by adjusting the variable tuning element as a result of its movement in the fore-and-aft direction. Specifically, the armature support plate 61 is formed with an upstanding portion 62 at its rear end, to which is secured one end of an armature 63, one each telescoped into a plurality of tuning coils, not shown. By changing the position of the armature relative to its associated tuning coil, the tuning frequency can be changed, as is well known in the art of pushbutton tuners, and as described in detail in U.S. Pat. No. 4,099,421 issued July 11, 1978 to the common assignee as the present application, for example.

The movable plates 31, 32 can be adjusted to a position corresponding to a desired frequency to be received, by means of a manually rotatable trim shaft 65 which is coupled with a clutch plate 64. The trim shaft 65 is rotatably mounted on the wall 14 of the baseplate 100, and has its end connected to a shaft 67 through a flexible joint 66. The shaft 67 is carried by a support plate 68, being an extension of the wall 14, so as to be horizontal and movable in a direction perpendicular to the plane of the drawing, and a pinion 69 is mounted on the rear end of the shaft 67. The pinion 69 is in meshing engagement with a crown gear 70 which is rotatably mounted on the baseplate 100. Another pinion 71 is mounted on the same shaft as the crown gear 70 and at a location below the latter, and meshes with a rack 72 which is formed along one edge of the armature support plate 61. Hence, by manually turning the trim shaft 65, the shaft 67 can be rotated through the joint 66 to rotate the crown gear 70 through the pinion 69. As the crown gear 70 rotates, the pinion 71 also rotates, causing the armature support plate 61 to move in the fore-and-aft direction. Such movement of the support plate 61 is transmitted through the link bars 55, 56 and the link levers 49, 51 to cause a lateral movement of the movable plates 31, 32 relative to each other. The clutch plate 64 is situated on the baseplate 100, and extends across the array of slide plates 18. The clutch plate 64 is formed with elongate slots 73 in its opposite ends, in which guide pins 74 secured to the baseplate 100 are loosely fitted to permit a lateral movement thereof. One end or the right-hand end, as viewed in FIG. 1, of the clutch plate 64 is connected with one end of a spring 75, the other end of which is anchored to the support plate 68, thus urging the clutch plate 64 toward the right, as viewed in FIG. 1, in a resilient manner. One end of the clutch plate 64 is formed with an upright bevelled cam edge 76 which extends in the direction of movement thereof. The bevelled cam edge 76 is shaped to have its elevation increased from left to right, as viewed in FIG. 1, so that when the clutch plate 64 is moved to the left against the bias of the spring 75, the cam edge 76 acts to raise the shaft 67 to terminate the engagement between the pinion 69 and the crown gear 70. The movement of the clutch plate 64 to the left occurs in response to the depression of the pushbutton 29 of each pushbutton actuator. Specifically, the clutch plate 64 is formed with a cam groove 78 for engagement with a projection 77 formed on the lower surface of the slide plate 18. As the projection 77 moves rearwardly, the cam groove 78 causes the clutch plate 64 to move to the left, allowing a rearward movement of the projection 77.

In operation, the individual control plates 21 are initially positioned relative to their associated slide plates 18 in order to establish particular frequencies which can be utilized by the operation of the pushbutton 29 of each pushbutton actuator. Such positioning takes place by drawing the pushbutton 29 from its inoperative position, shown for the pushbutton actuator 12 in FIG. 1, to a forward position, as shown for the pushbutton actuator 13, to disengage the wedge-shaped portion of the preset plate 28 which is secured to the pushbutton 29 from the locking lever 26, thus unlocking the control plate 21. Then the trim shaft 65 is turned to adjust the position of the armature 63, thus presetting a desired frequency. Assuming that the trim shaft 65 is turned counter-clockwise in order to preset a desired frequency, the crown gear 70 also rotates counter-clockwise. In response thereto, the armature support plate 60 moves rearwardly as does the armature 63. The rearward movement of the support plate 61 is transmitted through the pivot pin 57 to cause the link bars 55, 56 to move rearwardly, thus causing the link levers 49, 51 extending across the pivot pin 52 and the pins 53, 54 to turn counter-clockwise about the pivot pin 52. The angular movement of the link levers 49, 51 causes the movable plate 31 to move to the right and causes the movable plate 32 to the left. Assuming that the control plate 21 is located as indicated for the pushbutton actuator 12, the depression of the pushbutton 29 causes a rearward movement of the slide plate 18, whereby the upright pin 24 on the control plate 21 initially bears against the left-hand cam edge 36 formed in the movable plate 32. In response to a further depression of the pushbutton 29, the upright pin 24 tends to move rearwardly along the left-hand cam edge 36, with consequence that the control plate 21 rotates counter-clockwise about the pivot pin 22. Such rotation of the control plate 21 terminates when the upright pin 23 which has been free is brought into abutment against the left-hand cam edge 35 formed in the movable plate 31. When the two upright pins 23, 24 bear against the cam edges 35, 36, the upright pin 24 produces a force which causes the movable plate 32 to move to the left. However, since the movable plate 32 is connected with the movable plate 31 through the link levers 49, 51 and the link bars 55, 56, a movement of the movable plate 32 to the left will result in a movement of the movable plate 31 to the right. However, since the left-hand cam edge 35 of the movable plate 31 is engaged by the upright pin 23 as mentioned above, a movement of the movable plate 31 is precluded. In this manner, both of the movable plates 31, 32 are interlocked with each other by means of the upright pins 23, 24 on the control plate 21. Hence, the pushbutton 29 may be driven further to slip the wedge portion 27 of the preset plate 28 past the curved front end of the locking lever 26, causing the rear end of the locking lever 26 to bear against the front end of the control plate 21 strongly. In this manner, the control plate 21 is locked in position by adjusting of the trim shaft 65. Once the control plate is preset in this manner, its position remains unchanged unless the pushbutton 29 is brought to its reset position as mentioned initially. It is to be noted that an increased force as compared with that required during a normal pushbutton operation is necessary to slip the preset plate 28 into the space between the slide plate 18 and the locking lever 26. On the other hand, it is desirable that a usual channel selection can be achieved with a reduced force applied to the pushbutton 29. To this end, the slots 16, 17 formed in the walls 14, 15 of the baseplate 11 into which the slide plates 18 are received are chosen to be slightly greater than the profile of the slide plate 18, thus reducing the frictional resistance which these slide plates experience. Stated differently, the slide plates 18 are disposed in the slots 16, 17 with a certain clearance therebetween. Hence it will be understood that this in turn may cause a rattling of the slide plates 18 in the slots 16, 17 when the increased force is applied in the manner mentioned above, with consequent displacement of the movable plates 31, 32 though slightly. Such displacement results in a corresponding displacement of the variable tuning element to cause a mistuning. However, in the present embodiment, it will be seen from FIG. 4 that when a force $V_a$ is applied to the upright pins 23, 24 on the control plate 21 from the pushbutton 29, which causes them to move in the direction of movement of the slide plate 18, a component of force $V_b$ is developed which tends to move the movable plates 31, 32 in the leftward direction. Because these components $V_b$ act in the same direction, the movable plates 31, 32 which are connected together through the link levers 49, 51 and link bars 55, 56 are prevented from rotating relative to each other, thus precluding a displacement of the movable plates 31, 32. If a clearance is present between the right-hand upstanding rib 19 on the slide plate 18 and the edge of either slot 16, 17, the slide plate 18 cannot move so long as the upright pins 23, 24 on the control plate 21 remain engaged with the cam edges 35, 36. If a clearance is present between the left-hand upstanding rib 19 on the slide plate 18 and the edge of either slot 16, 17, the upright pins 23, 24 will move to the left by an amount corresponding to the clearance, along the cam edges 35, 36 of the movable plates 31, 32, resulting in a slight movement of the slide plate 18 to the left, but without accompanying a corresponding movement of the movable plates 31, 32.

In response to the component force $V_b$ applied to the movable plates 31, 32, a force is applied to the link lever 49 which causes it to rotate clockwise about the pivot pin 52, thus tending to pull the link bar 55 forwardly. On the other hand, a force is applied to the link lever 51 which causes it to rotate counter-clockwise about the pivot pin 52, tending to push the link bar 56 rearwardly. In this manner, the link levers 59, 51 and the link bars 55, 56 experience forces acting in the opposite directions, and one of the ends of the link levers 55, 56 are pivotally mounted in common on the armature support plate 61 by means of the pivot pin 57, so that any rattling in the pivotal mounting or connection of the movable plates 31, 32, the link levers 49, 51, the link bars 55, 56 and the support plate 61 is removed. Consequently, the movable plates 31, 32 can be accurately located to bring the control plate 21 to a position corresponding to the position of the armature 63 as established by the trim shaft 65. Since the movable plates 31, 32 are only supported by the pivot pins 39, 52 so as to be movable in the lateral direction, a smooth movement in the lateral direction is assured. Since the left-hand end of each movable plate 31, 32 is connected together by the pair of link bars 37, 40, the link bars can be pivotally mounted on the baseplate with a greater tolerance than that which is allowable when the pair of movable plates 31, 32 are connected together by a single link bar, thus facilitating the location of the pivot pin 39. In this manner, any error in the location of the pivot pin can be accommodated for, thus allowing an accurate parallelism between the pair of movable plates 31, 32 to be maintained.

Figures 4, 5:
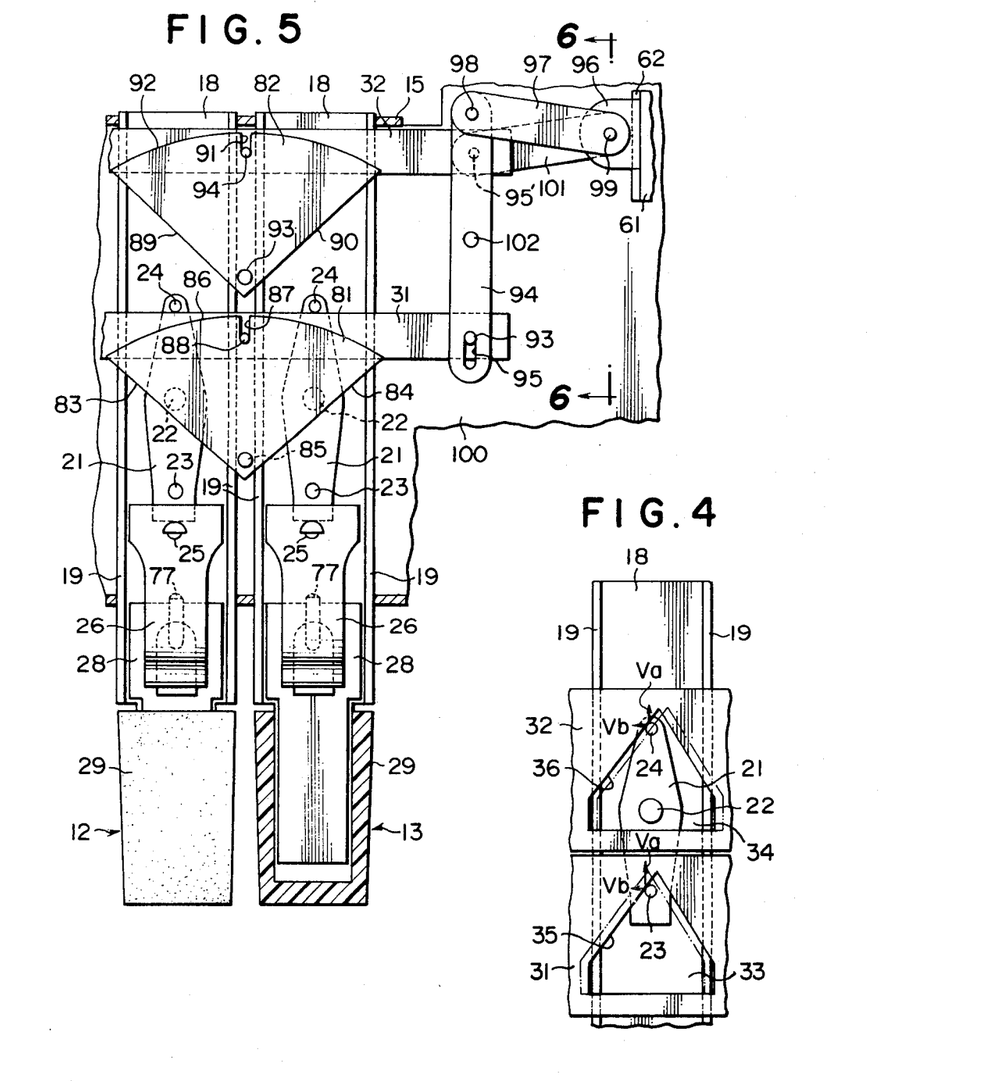
FIG. 4 is a plan view illustrating the relationship between the control plate and the cam member in the first embodiment.
FIG. 5 is a plan view, partly cut away, of essential parts of a second embodiment of the invention.

Referring to FIG. 4, a normal channel selection after the respective pushbutton actuators have been preset to the desired frequencies will now be described. As the pushbutton 29 is pushed to move the slide plate 18 rearwardly, the upright pin 24 on the control plate 21 initially engages the left-hand cam edge 36 formed in the movable plate 32, causing the movable plate 32 to move to the left. Such movement is transmitted through the link levers 49, 51 and the link bars 55, 56 shown in FIG. 1 to cause the movable plate 31 to move to the right, whereby the latter moves from its phantom line position to its solid line position. As the slide plate 18 moves further rearward, the upright pin 23 on the control plate 21 bears against the right-hand cam edge 35 formed in the movable plate 31, whereby a movement of the movable plate 31 to the right is blocked. Consequently, a movement of the movable plate 32 is also precluded, inhibiting a further rearward movement of the slide plate 18. The position assumed by the movable plates 31, 32 when such rearward movement is blocked represents the preset position of the pushbutton actuator. When the upright pins 23, 24 both bear against the cam edges 35, 36 to complete a channel selection, the component force $V_b$ of the force $V_a$ with which the pushbutton 29 is pushed acts on the respective points of engagement. As mentioned previously, these component forces $V_b$ are developed in the same direction, and a reaction force to these component forces is developed by the control plate 21 and acts on the slide plate 18, which is therefore urged to the left, as viewed in the drawings, thus removing any rattling which might otherwise occur between the side of the slide plate 18 and the slots 16, 17 in the baseplate 100, or in the pivotal connection between the movable plates 31, 32 and the armature support plate 61. Since the movable plates 31, 32 are supported to be movable in the lateral direction by means of the link bars 37, 40 and the link levers 49, 51 which are pivotally mounted on the pivot pins 39, 52, the pushbutton 29 can be pushed in with a force of a reduced magnitude.

Figure 6:
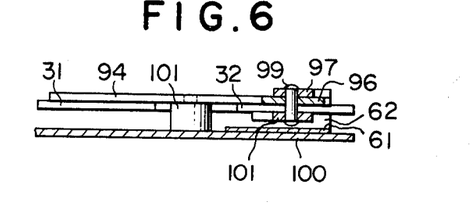
FIG. 6 is a cross section taken along the line 6—6 shown in FIG. 5.

Referring to FIGS. 5 and 6, another embodiment of a mechanism for moving the movable plates and the connection mechanism between the movable plates and the armature support member will be described. In this embodiment, the interlocked relationship between the slide plate 18 and the movable plates 31, 32 is achieved by means of a pair of sector-shaped front and rear cam members 81, 82. Specifically, the front cam member 81 is formed with a linear cam edge 82 which is adapted to engage the upright pin 23 on the actuator 12 whenever the pushbutton actuator 12 is driven rearward, and another linear cam edge 84 which is adapted to engage the upright pin 23 on the adjacent actuator 13 whenever the latter is driven rearward. The cam member 81 is pivotally mounted by means of a pin 85 which is located adjacent to the point of intersection between both of the cam edges 83, 84. The lower end of the pivot pin 85 extends through a clearance between the slide plates 18 of the adjacent pushbutton actuators 12, 13 and is secured to the baseplate 100. In this manner, the front cam member 81 is associated with a pair of adjacent pushbutton actuators 12, 13, and thus is capable of pivotal motion in response to either actuator. The front cam member 81 also includes an arcuate edge 86 which is centrally formed with a notch 87 into which the lower end of a connecting pin 87 having its upper end secured to the movable plate 31 is loosely fitted. The rear cam member 82 is similarly formed with a linear cam edge 89 engageable with the upright pin 24 on the pushbutton actuator 12, another linear cam edge 90 engageable with the upright pin 24 on the other pushbutton actuator 13, and an arcuate edge 92 which is formed with a notch 91. The cam member 82 is pivotally mounted on a pin 93, and is connected to the movable plate 32 through a connecting pin 94 which is loosely fitted into the notch 46. It is to be noted that the front and the rear cam members 81, 82 are located so as to be slidable over the upper end faces of the upstanding ribs 19 of the slide plates 18 associated with the pushbutton actuators 12, 13, and the movable plates 31, 32 are located above these cam members.

On the other hand, the connection between the movable plates 31, 32 and the armature support member 61 is constructed as follows: specifically, an upright pin 93 is provided on the upper surface of the movable plate 31 at its right-hand end, as viewed in FIG. 5, and is loosely fitted in an elongate slot 95 which extends lengthwise of a linear link lever 94. The other end of the link lever 94 is connected to one end of a link bar 97 through a pivot pin 98. The other end of the link bar 97 is connected to a tougue 96 on the upstanding portion 62 of the armature support plate 61 by means of pivot pin 99. A link bar 101 which is similar to the link bar 97 is pivotally mounted on pivot pins 95', 99. The pivot pin 95' is provided on the upper surface of the movable plate 32 at its right-hand end. Intermediate its length, the link lever 94 is pivotally mounted on the baseplate 100 by means of a pivot pin 102. In this embodiment, the armature support plate 61 is arranged to move in the same direction as the movable plates 31, 32. Such armature support plate and clutch mechanism are disclosed in detail in the aforementioned U.S. Pat. No. 4,099,421, and hence will not be described herein.

Now, assume that the movable plate 32 is driven to the right, as viewed in FIG. 5, as the tuning element is adjusted. The movement of the movable plate 32 to the right is transmitted through the rockable link member 52 to cause a movement of the movable plate 31 to the left. As the movable plates 31, 32 move in this manner, the cam members 33, 34 rotate counterclockwise and clockwise, respectively, about their pivot pins 85, 93, respectively. If the pushbutton 29 is new driven rearward, the slide plate 18 moves rearward, whereby the upright pin 23 on the control plate 21 initially bears against the linear cam edge 83 of the front cam member 81. As the pushbutton 29 is driven further rearward, the upstanding pin 23 tends to move rearward along the cam edge 83, with consequence that the control plate 21 is turned clockwise about its pivot 22. The angular movement of the control plate 21 is stopped when the upright pin 24, which has been free, comes into abutment against the linear cam edge 89 of the rear cam member 82. When the upright pins 23, 24 engage the cam edges 83, 89 of the respective cam members 81, 82, the upright pin 23 exerts a force to the cam member 33 which causes it to rotate clockwise. Such angular drive to the cam member 81 is transmitted through the connecting pin 88 to cause a movement of the movable plate 31 to the right. However, the movable plate 31 is connected to the movable plate 32 through the link members 94, 97, 101 so that as the movable plate 31 moves to the right, this causes the movable plate 32 to move to the left. Such movement of the movable plate 32 is transmitted through the connecting pin 94 to cause an angular movement of the rear cam member 82 counter-clockwise, whereby the latter cam member 82 tends to rotate counter-clockwise. However, as mentioned previously, the upright pin 24 on the control plate 21 bears against the cam edge 89 of the cam member 82, thus preventing an angular movement thereof. In this manner, the pair of cam members 33, 34 are locked to each other through the upright pins 23, 24 on the control plate 21. As in the first mentioned embodiment, a pushing force $V_a$ acts on the upright pins 23, 24 on the control plate 21 in a direction parallel to the direction of movement of the slide plate 18, whereby component forces $V_b$ are developed which cause the cam members 81, 82 to rotate clockwise. Since the component forces $V_b$ act in the same direction, the cam members 81, 82 which are connected together through the link bar 94 are prevented from rotating, and hence cannot move the movable plates 31, 32. When a force acting in the same direction is applied to the movable plates 31, 32, forces act on the link bars 97, 101 in the opposite directions, so that the armature support plate 61 cannot move. Since the link bars 97, 101 are pivotally mounted in common on the support plate 61, any rattling in the pivotal mounting of the movable plates 31, 32, the link lever 94 and the link bars 97, 101 is removed. Arrangements such as the clutch mechanism or manual tuning mechanism shown and described in connection with the first mentioned embodiment are directly applicable in the second and subsequent embodiments to be described later, and therefore will not be shown and described.

Figure 7:
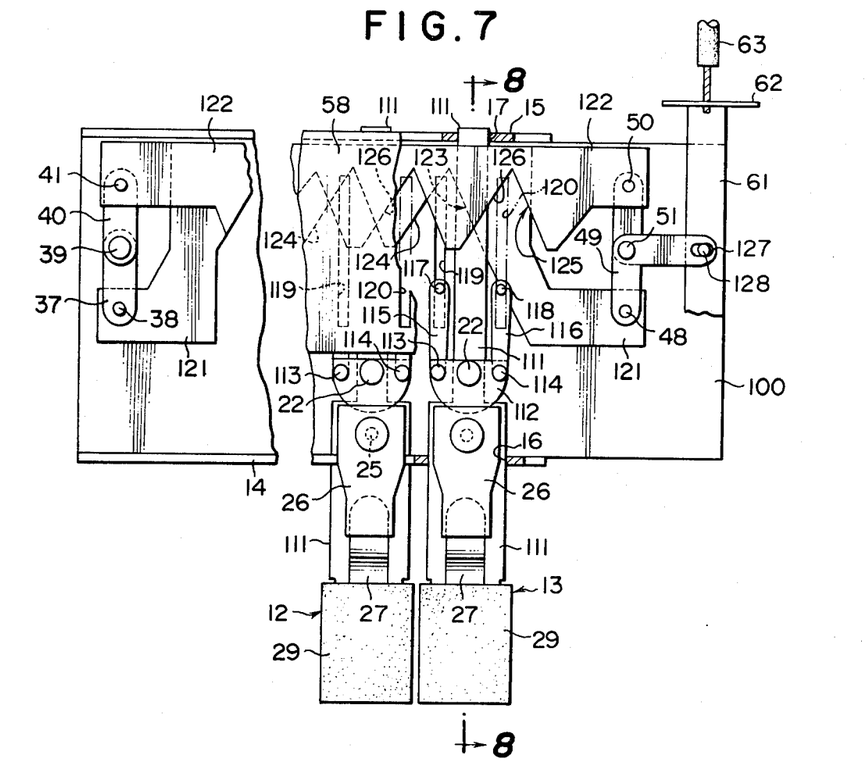
FIG. 7 is a plan view, partly cut away, of essential parts of a third embodiment of the invention.
Figure 8:
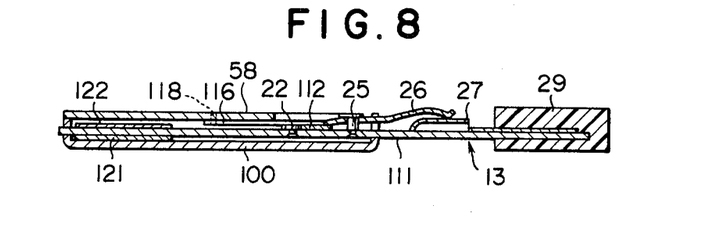
FIG. 8 is a longitudinal section taken along the line 8—8 shown in FIG. 7.

FIGS. 7 and 8 show a third embodiment of the invention in which the movable plates are formed with cam edges as in the first mentioned embodiment. Considering the pushbutton actuator 13, by way of example, a slide plate 111 having one end which is slidably inserted into the pushbutton 19 is in the form of a flat plate and has a reduced width in its region which is located rearwardly of the rear end of the plate locking lever 26 which is placed thereon. A control plate 112 which is situated between the plate locking lever 26 and the slide plate 111 is formed with a semi-circular front edge, and is pivotally mounted on the slide plate 111 by means of pivot pin 22. A pair of pivot pins 113, 114 are fixedly mounted on the rear end of the control plate 112 and are laterally spaced apart. A pair of rocking bars 115, 116 which extend toward the rear end of the slide plate 111 have their one ends pivotally mounted on the pivot pins 113, 114. At its top end, an upright pin 117 is mounted on the other end of the rocking lever 115 and has its lower end extending through the baseplate 100. At its lower end, an upright 118 is mounted on the other end of the rocking lever 116, and has its top end extending toward the upper cover member 58. The upright pin 117 is loosely fitted in a guide slot 119 formed in the baseplate 100 while the upright pin 118 is loosely fitted in a guide slot 120 formed in the top cover member 58. The respective guide slots 119, 120 are elongate in the direction of movement of the slide plate 111.

A pair of movable plates 121, 122 are disposed so as to be overlapping each other over their substantial area. The lower movable plate 121 has a front edge in which inverted V-shaped notches 123 are formed, the upright pin 117 engageable the cam edge 124 of the notch 123. The upper movable plate 122 is smilarly formed with notches 125, with the upright pin 118 engageable with the cam edge 126 thereof. The pair of movable plates 121, 122 are arranged so that their notches 123, 125 are in overlapping relationship with each other. The right-hand end, as viewed in FIG. 7, of the movable plates 121, 122 pivotally carries upright pins 48, 50 on which substantially L-shaped link levers 49, 51 are pivotally mounted in the similar manner as in the first mentioned embodiment. The other end of the link levers 49, 51 are formed with slots 127 which are elongate in the direction of movement of the movable plates 121, 122 and in which a pin 128 secured to the armature support plate 61 is loosely fitted.

Assume now that the variable tuning element has been preset to a position corresponding to a desired frequency, and accordingly the movable plate 121 has been moved to the left from the position shown while the movable plate 122 has been moved to the right. When the pushbutton 29 is pulled forwardly from its inoperative position shown to disengage the control plate 112 from the plate locking lever 26, and the pushbutton 29 then pushed in rearwardly, the rocking bars 115, 116 on the control plate 112 will move rearwardly with their upright pins 117, 118 being guided by the guide slots 119, 120. As a result of such movement, the upright pin 118 initially engages the left-hand cam edge 126 of the notch 125 in the movable plate 122 to prevent a further movement thereof. On the other hand, the upright pin 117 is still capable of movement, so that the control plate 112 rotates clockwise about the pivot pin 22, whereby only the upright pin 117 continued to move rearwardly. When the upright pin 117 engages the left-hand cam edge 124 of the notch 123 formed in the movable plate 121, a further movement of the upright pin 117 is blocked, thereby terminating the positioning of the control plate 112. Subsequently, the pushbutton 29 may be pushed in further rearward to lock the control plate 112 with the plate locking lever 26, in the similar manner as mentioned above in connection with the first embodiment. A subsequent normal operation takes place in the similar manner as in the first embodiment. Again, when the presetting operation and the normal channel selection have been completed, the component forces $V_b$ which are derived from the pushing force $V_a$ applied to the pushbutton 29 occur in the same direction to remove any rattling between the side of the slide plate 111 and the slots 16, 17 in the baseplate 100, and also removes any rattling in the pivotal mounting between the movable plates 121, 122 and the armature support plate 61.

Figure 9:
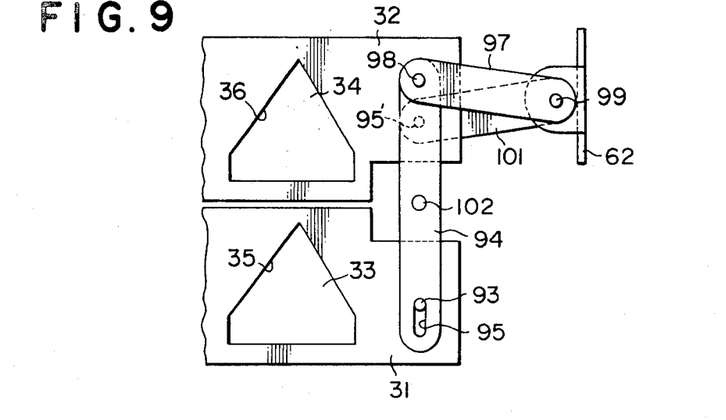
FIG. 9 is a plan view of another form of connection mechanism between the control plate and the variable tuning element.

FIG. 9 shows another form of a connection mechanism between the movable plates and the armature support plate which may be used in the arrangement of the first embodiment. In this instance, the armature 63 is arranged to be movable in the same direction as the direction of movement of the movable plates 31, 32. The connection mechanism of this embodiment is identical with the second embodiment mentioned above, and its operation will not be described. It should be understood that this connection mechanism may be used in the third embodiment mentioned above.

Figure 10:
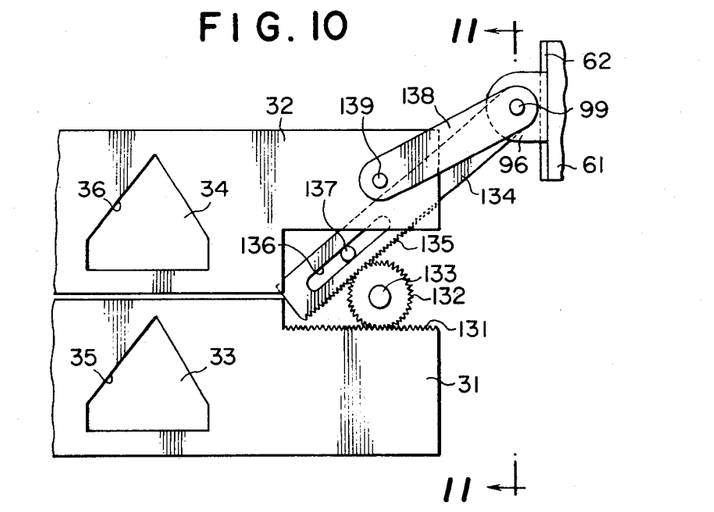
FIG. 10 is a plan view of a further form of the connection mechanism between the control plate and the variable tuning element.
Figure 11:
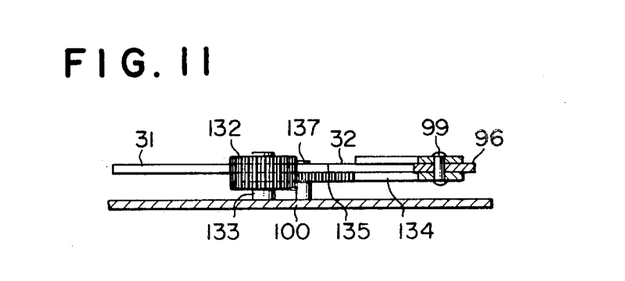
FIG. 11 is a cross section taken along the line 11—11 shown in FIG. 10.

FIGS. 10 and 11 show a further form of connection mechanism between the movable plates and the armature support plate which may be used in the first embodiment. As in the second embodiment shown in FIG. 5 and the fourth embodiment shown in FIG. 9, the armature 63 is arranged to be movable in the same direction as the direction of movement of the movable plates 31, 32. Along the rear edge, the end of the movable plate 31 which is located adjacent to the armature support plate 61 is formed with a rack 131, which is in meshing engagement with the pinion 132 which is in turn rotatably mounted on a shaft 133 fixedly mounted on the baseplate 100. A rack bar 134 is located on the opposite side of the pinion 132 from the rack 131, and also meshes with the pinion 132. As shown, the rack bar 134 extends in an oblique direction, and has its rear end pivotally mounted on a pivot pin 99 on the tougue 96 which is formed on the upstanding portion 62 of the armature support plate 61. The rack bar 134 is also formed with a lengthwise elongate slot 136 in which a guide pin 137 having its lower end secured to the baseplate 100 is loosely fitted. The guide pin 137 cooperates with the slot 136 to guide the direction of movement of the rack bar 134. A link bar 138 has its one end pivotally mounted on the pin 99, and has its other end pivotally mounted on a pivot pin 139 secured to the movable plate 32. As a result of such arrangement, component forces $V_b$ acting on the movable plates 31, 32 are developed in the same direction as in the previous embodiment, so that when the two movable plates 31, 32 are urged to move in the same direction, forces are applied to the rack lever 134 and the link bar 138 in opposite directions, with consequence that any rattling in the various pivotal mountings and in the mating portions between the racks 131, 135 and the pinion 132 is removed. It should be understood that this connection mechanism may be applied to the second and the third embodiment described above.

Figure 12:
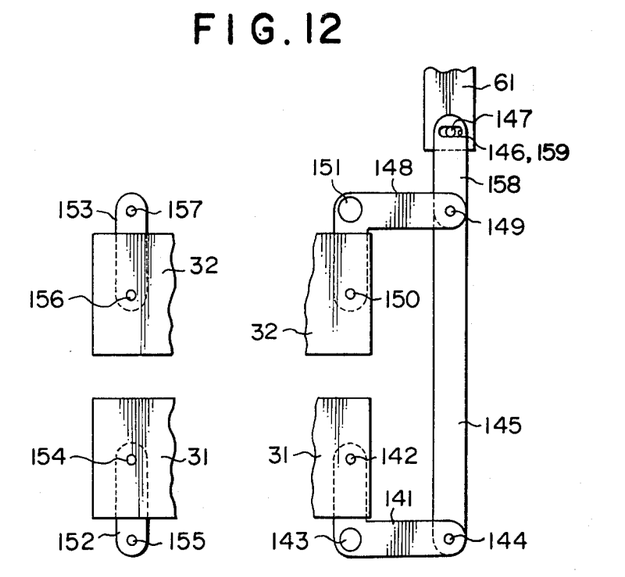
FIG. 12 is a plan view illustrating the manner of supporting the movable plates and also illustrating still another form of the connection mechanism between the movable plate and the variable tuning element.

FIG. 12 shows still another embodiment of the connection mechanism between the movable plates and the armature support plate and of the mechanism to support the other ends of the movable plates. The end of the movable plate 31 located adjacent to the armature support plate 61 carries a pivot pin 142 on which one end of a substantially L-shaped link lever 141 is pivotally mounted. A pivot pin 143 which has its lower end supported by the baseplate is attached to the bend of the link lever 141, which is therefore rockable about the pin 143. The other end of the link lever 141 carries a pivot pin 144 on which one end of a link bar 145 is pivotally mounted. The other end of the link bar 145 is formed with a slot 146 which is elongate in a direction parallel to the direction of movement of the movable plates 31, 32 and in which a pin 147 which has its lower end mounted on the armature support plate 61 is loosely fitted. Adjacent to the other end, the movable plate 32 carries a pivot pin 150 on which one end of a link lever 148, similar in configuration to the link lever 141, is pivotally mounted. The other end of the link lever 148 is pivotally mounted on one end of a link bar 158 by a pivot pin 149. The bend of the link lever 148 is pivotally mounted on a pin 151 which is fixedly mounted on the baseplate. The other end of the link bar 158 is formed with a slot 159 which is similar to the slot 146 and in which the pin 147 is loosely fitted. Consequently, component forces $V_b$ acting in the same direction are applied to the movable plates 31, 32 as before, and when these plates are urged to move in the same direction, the link levers 141, 148 tend to rotate in the opposite directions about their respective pivot pins 143, 151 to lock the link bar 145 in a reliable manner, thus completely removing any rattling in the pivotal mountings. In the present embodiment, the other ends of the movable plates 31, 32 are supported by link bars 152, 153 so as to be movable in the lateral direction over the baseplate. Specifically, a link bar 152 has its one end pivotally mounted on the pivot pin 154 which is located centrally on the lower surface of the movable plate 31, and has its other end pivotally mounted on a pivot pin 155 which has its lower end secured to the baseplate. In a similar manner, another link bar 153 is pivotally mounted on the baseplate 32 by means of pivot pins 156, 157. In this manner a manufacturing tolerance is allowed in the location where the link bars 152, 153 which enable a lateral movement of the movable plates 31, 32 are pivotally mounted on the baseplate. Any slight error in the location of these link bars on the baseplate can be accommodated for, allowing the pair of the movable plates 31, 32 to move in the lateral direction while maintaining their parallel relationship.

Figure 13A:
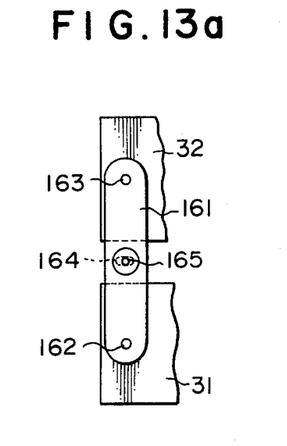
FIGS. 13a and 13b are plan views illustrating the manner of supporting the end of the movable plates which is remote from the variable tuning element.

FIGS. 13a and 13b show another arrangement to accommodate for any error in the location of the pivotal mountings. In FIG. 13a, the pair of movable plates 31, 32 are connected together by a single link bar 161 instead of the pair of link bars shown in FIG. 12. Specifically, one end of the link bar 161 is pivotally mounted on a pivot pin 162 on the movable plate 31 while its other end is pivotally mounted on a pivot pin 163 on the movable plate 32. The link bar 161 is centrally formed with an elongate slot 164 which extends parallel to the direction of movement of the movable plates 31, 32 and in which a pin 165 having its lower end secured to the baseplate is loosely fitted. The provision of the elongate slot 164 permits any slight error in the location of the pivotal mounting of the link bar to be accommodated for. Such elongate slot may be provided in the pivotal connection between either movable plate 31 or 32 and the link bar 161.

Figure 13B:
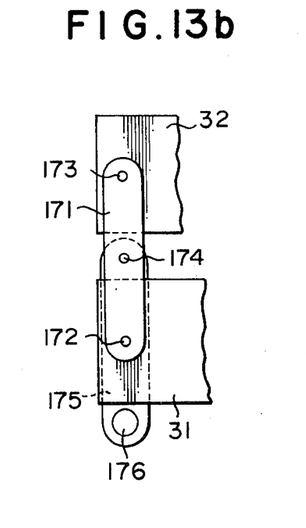

In FIG. 13b, a link bar 171 has its opposite ends pivotally mounted on pivot pins 172, 173 which are fixedly mounted on the movable plates 31, 32, respectively, and carries, intermediate its length, a pivot pin 174 on which one end of a rotatable link bar 175 is mounted. The other end of the rotatable link bar 175 is pivotally mounted on a pin 176 which has its lower end secured to the baseplate. In this arrangement, the pivot pin 174 which represents the central pivotal mounting of the link bar 171 is movable relative to the baseplate, and hence any error in the location of the link bar 171 and the rotatable link bar 175 can be accommodated for. In this manner, a movement of the movable plates 31, 32 parallel to each other is facilitated. The connection mechanism and the support mechanism shown in FIGS. 12, 13a and 13b are obviously applicable to the previous embodiments described above.

What is claimed is:

1. A pushbutton tuner including a support, tuning means mounted on the support so as to be movable to positions corresponding to preset tuning frequencies, and a plurality of pushbutton actuators which may be selectively preset to bring the tuning means to positions corresponding to the respective tuning frequencies, each pushbutton actuator including a slide member having its opposite ends carried by the support so as to be movable between its inoperative and its operative positions relative to the support in a direction perpendicular to the direction of movement of the tuning means, a movable control member mounted on the slide member for controlling the movement of the tuning means, the tuning means including a pair of movable members, a variable tuning element which is adjusted in accordance with a stroke through which the pair of movable members move, a link assembly connecting the pair of movable members with the variable tuning element, the link assembly being constructed such that whenever one of the movable members moves in one direction, the other movable member is caused to move in the opposite direction, and transmitting means responsive to a movement of the slide member to its operative position for transmitting the movement of the control member to at least one of the movable members so as to cause the movable member to move in one direction, the movement of said one movable member in said one direction being terminated when a movement of the other movable member in the opposite direction which occurs in response to the movement of said one movable member is constrained by the control member, the link assembly including first and second substantially L-shaped link levers having their one end extending in opposite directions and having their other end disposed in overlapping relationship, and first and second link bars having their one end connected to the other ends of the first and the second link levers, respectively, said one end of the first link lever being pivotally connected with one end of said one movable member, said one end of the second link lever being pivotally connected with one end of said other movable member, the bend of the first and the second link levers being pivotally mounted on the support in common, and the other ends of the first and the second link bars being pivotally mounted on the movable member of the variable tuning element.

2. A pushbutton tuner according to claim 1 in which the link assembly includes a third link bar having its one end connected to said one end of the first link bar, and the other end of the third link bar being pivotally mounted in common on the movable member of the variable tuning element.

3. A pushbutton tuner according to claim 1 in which the other ends of the pair of movable members are carried by another link assembly which support them in a manner to permit the movement of the pair of movable members in opposite directions, said another link assembly including first and second link bars having their one end pivotally mounted in common on the support, the other end of the first link bar being pivotally mounted on said one movable member, and the other end of the second link bar being pivotally mounted on the other movable member.

4. A pushbutton tuner according to claim 1 in which the other ends of the pair of movable members are carried by another link assembly which support them in a manner to permit the movement of the pair of movable members in opposite directions, said another link assembly including a pair of link bars having their one end pivotally mounted on the respective movable members and having their other end pivotally mounted on the support.

5. A pushbutton tuner according to claim 1 in which the other ends of the pair of movable members are carried by another link assembly which support them in a manner to permit the movement of the pair of movable members in opposite directions, said another link assembly including a link bar having its one end pivotally mounted on said one movable member and having its other end pivotally mounted on the other movable member, the link bar being formed with an elongate slot intermediate its length which extends parallel to the direction of movement of the movable members, and a pin mounted on the support being fitted in the slot.

6. A pushbutton tuner according to claim 1 in which the other ends of the pair of movable members are carried by another link assembly which support them in a manner to permit the movement of the pair of movable members in opposite directions, said another link assembly including a first link bar having its one end pivotally mounted on said one movable member and having its other end pivotally mounted on said other movable member, and a second link bar having its one end pivotally mounted on the first link bar intermediate its length and having its other end pivotally mounted on the support and extending in the same direction as the first link bar.

7. A pushbutton tuner according to claim 1 in which the control member extends lengthwise of the slide member and carries upright pins on its opposite ends, the transmitting means including a first and a second cam edge formed on the pair of movable members, the cam edges being located such that one of the upright pins bears against one of the cam edges to cause said one movable member to move in one direction, the movement being transmitted through the link assembly to cause said other movable member to move in the opposite direction from that of said one movable member until the other upright pin bears against the other cam edge, whereupon the movement of said other movable member is blocked, and wherein at least the portions of the pair of movable members where the cam edges are formed are disposed in overlapping relationship.

8. A pushbutton tuner according to claim 7 in which the control member has two arm members extending lengthwise of the slide member, each arm member carrying upright pins on its top ends, the transmitting means including first and second cam edges formed on the pair of movable members, the cam edges being located such that one of the upright pins bears against one of the cam edges to cause said one movable member to move in one direction, the movement being transmitted through the link assembly to cause said other movable member to move in the opposite direction from that of said one movable member until the other upright pin bears against the other cam edge, whereupon the movement of said other movable member is blocked.

9. A pushbutton tuner according to claim 1 in which the control member extends lengthwise of the slide member and fixedly carries upright pins on its opposite ends and wherein the transmitting means includes a first and a second cam member each having its one end pivotally mounted on the support, the other end of the first and the second cam member being pivotally connected with one and the other of the movable members, respectively, each of the first and the second cam member having a cam edge, one of the cam edges being effective to cause an angular movement of one of the cam members in one direction in response to its engagement with one of the upright pins to thereby cause a movement of the other movable member in the opposite direction from the movement of said one movable member, the other cam edge being brought into engagement with the other upright pin to block the angular movement of the other cam member.

10. A pushbutton tuner including a support, tuning means mounted on the support so as to be movable to positions corresponding to preset tuning frequencies, and a plurality of pushbutton actuators which may be selectively preset to bring the tuning means to positions corresponding to the respective tuning frequencies, each pushbutton actuator including a slide member having its opposite ends carried by the support so as to be movable between its inoperative and its operative positions relative to the support in a direction perpendicular to the direction of movement of the tuning means, a movable control member mounted on the slide member for controlling the movement of the tuning means, the tuning means including a pair of movable members, a variable tuning element which is adjusted in accordance with a stroke through which the pair of movable members move, a link assembly connecting the pair of movable members with the variable tuning element, the link assembly being constructed such that whenever one of the movable members moves in one direction, the other movable member is caused to move in the opposite direction, and transmitting means responsive to a movement of the slide member to its operative position for transmitting the movement of the control member to at least one of the movable members so as to cause the movable member to move in one direction, the movement of said one movable member in said one direction being terminated when a movement of the other movable member in the opposite direction which occurs in response to the movement of said one movable member is constrained by the control member, the link assembly including a rack mounted on said one movable member, a pinion rotatably carried by the support and meshing with the rack, a rack bar carrying a rack on its one end which meshes with the pinion and supported to be movable lengthwise, and a link bar having its one end pivotally mounted on said other movable member, the other end of the rack bar and the link bar being pivotally mounted in common on the movable member of the variable tuning element.

* * * * *